United States Patent
Imaoka et al.

(10) Patent No.: US 8,110,929 B2
(45) Date of Patent: Feb. 7, 2012

(54) SEMICONDUCTOR MODULE

(75) Inventors: Toshikazu Imaoka, Gifu (JP); Tetsuro Sawai, Gifu (JP); Kenichi Kobayashi, Gunma (JP); Atsushi Nakano, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 93 days.

(21) Appl. No.: 12/602,462

(22) PCT Filed: May 27, 2008

(86) PCT No.: PCT/JP2008/001316
§ 371 (c)(1),
(2), (4) Date: May 3, 2010

(87) PCT Pub. No.: WO2008/149508
PCT Pub. Date: Dec. 11, 2008

(65) Prior Publication Data
US 2010/0252936 A1    Oct. 7, 2010

(30) Foreign Application Priority Data

May 31, 2007   (JP) .................................. 2007-146258

(51) Int. Cl.
*H01L 23/48* (2006.01)
(52) U.S. Cl. .......... 257/777; 257/E23.01; 257/E25.005; 257/E25.006; 257/E25.021; 257/E25.027; 257/E23.085
(58) Field of Classification Search .......... 257/686, 257/723, 777, E25.005, E25.006, E25.021, 257/E25.027, E23.01, E23.085; 438/109
See application file for complete search history.

(56) References Cited

U.S. PATENT DOCUMENTS

| | | | |
|---|---|---|---|
| 5,640,044 A | | 6/1997 | Takehashi et al. |
| 6,133,637 A | * | 10/2000 | Hikita et al. ................... 257/777 |
| 6,303,998 B1 | * | 10/2001 | Murayama .................... 257/778 |
| 6,376,914 B2 | * | 4/2002 | Kovats et al. ................. 257/777 |
| 7,247,945 B2 | * | 7/2007 | Sawada .......................... 257/738 |
| 7,714,427 B2 | * | 5/2010 | Wong et al. .................... 257/693 |
| 7,859,092 B2 | * | 12/2010 | Liu et al. ....................... 257/686 |

FOREIGN PATENT DOCUMENTS

| | | |
|---|---|---|
| JP | 07-335826 | 12/1995 |
| JP | 11-186326 | 7/1999 |
| JP | 2003-324180 | 11/2003 |
| JP | 2004-023045 | 1/2004 |

OTHER PUBLICATIONS

International Preliminary Report on Patentability and Written Opinion of the International Searching Authority, issued in corresponding International Patent Application No. PCT/2008/001316, mailed Jan. 21, 2010.

* cited by examiner

*Primary Examiner* — Jasmine Clark
(74) *Attorney, Agent, or Firm* — McDermott Will & Emery LLP

(57) ABSTRACT

A semiconductor module includes: a substrate having a wiring layer; a first rectangular-shaped semiconductor device mounted on one surface of the substrate; a second rectangular-shaped semiconductor device mounted on the other surface of the substrate. The first semiconductor device is arranged such that each side thereof is not parallel to that of the second semiconductor device, and that the first semiconductor device is superimposed on the second semiconductor device, when seen from the direction perpendicular to the surface of the substrate.

16 Claims, 15 Drawing Sheets

SEMICONDUCTOR MODULE

CROSS-REFERENCE TO RELATED APPLICATIONS

This application is based upon International Application No. PCT/JP2008/001316, filed May 27, 2008 and claims the benefit of priority from the prior Japanese Patent Application No. 2007-146258, filed May 31, 2007, the entire contents of which are incorporated herein by reference.

BACKGROUND OF THE INVENTION

1. Field of the Invention

The present invention relates to a semiconductor module, in particular, to a semiconductor module provided with semiconductor devices on both surfaces of its substrate.

2. Description of the Related Art

Recently, with the trend toward miniaturization and high performance of electronic devices, there is a demand for reduction of the size of circuit devices used in electronic devices. As a way to achieve this, it can be considered that an area of a circuit device is reduced by arranging devices on both surfaces of its substrate.

Wiring of a substrate is generally formed of Cu, the coefficient of thermal expansion of which is greatly different from that of a resin filled between the wirings. If the wirings are formed so as to have a uniform pattern across the whole substrate, a stress occurring due to a difference between the coefficients of thermal expansion of the wiring and the resin during a heat treatment, is generated uniformly across the whole substrate. Therefore, it is thought that the substrate does not deform greatly.

However, wiring patterns in respective wiring layers including the surface and the underside of a substrate are generally different from each other, and in many cases, each wiring pattern is not formed so as to be symmetric in a plane. Accordingly, when some sort of heat is applied to such a substrate, a stress occurring at each area of the substrate is not equal to each other, causing the substrate to deform and warp in a complicated way.

In contrast, a semiconductor device mounted on a substrate generally has a higher stiffness than that of the substrate, and hence warp of the substrate can be suppressed. In particular, the semiconductor devices provided on both surfaces of a substrate can further enhance the stiffness of the substrate. However, even in this case, the warp of the substrate is likely to occur in a direction depending on the shape or arrangement of the semiconductor devices.

SUMMARY OF THE INVENTION

In view of the aforementioned circumstances, the present invention has been made.

An embodiment of the present invention relates to a semiconductor module. The semiconductor module comprises: a substrate configured to have a wiring layer; a first rectangular-shaped semiconductor device configured to be mounted on one surface of the substrate; a second rectangular-shaped semiconductor device configured to be mounted on the other surface of the substrate, wherein the first semiconductor device is arranged such that each side of the first semiconductor device is not parallel to that of the second semiconductor device, and that the first semiconductor device is superimposed on the second semiconductor device, when seen from the direction perpendicular to the surface of the substrate.

According to the embodiment, the warp of the substrate in the directions of two diagonal lines of the second semiconductor device mounted on the other surface of the substrate, can be particularly suppressed. The first semiconductor device, arranged so as to be superimposed on the second semiconductor device when seen from the direction perpendicular to the surface of the substrate, is mounted on the surface opposed to the second semiconductor device, with the substrate sandwiched between the two. Because the first semiconductor device is arranged such that each side thereof is not parallel to that of the second semiconductor device, two diagonal lines of the first semiconductor device are directed to the directions different from those of two diagonal lines of the second semiconductor device, in many cases. Therefore, the warp of the substrate in the directions of the diagonal lines of the first semiconductor device can be suppressed, in addition to those of the two diagonal lines of the second semiconductor device.

Another embodiment of the present invention relates to a mobile device. The mobile device is configured to be mounted with the aforementioned semiconductor module.

Advantage of the Invention

BRIEF DESCRIPTION OF THE DRAWINGS

Embodiments will now be described, byway of example only, with reference to the accompanying drawings which are meant to be exemplary, not limiting, and wherein like elements are numbered alike in several Figures, in which.

DETAILED DESCRIPTION OF THE INVENTION

Figure 1A:
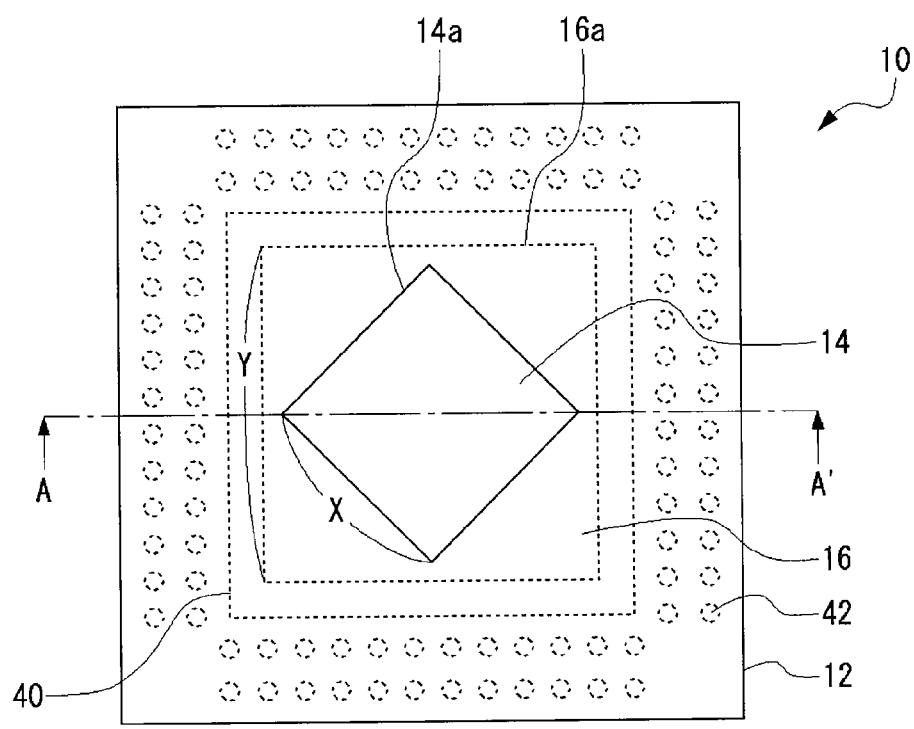
FIG. 1A is a schematic top view schematically illustrating a main portion of a semiconductor module 10 according to a first embodiment.

The present invention will be described below with reference to the accompanying drawings based on preferred embodiments. In the descriptions of the drawings, the same elements shall be denoted by the same reference numerals, and the duplicative explanations will be omitted appropriately. The embodiments described below do not intend to limit the scope of the present invention, but exemplify the invention.

First Embodiment

Figure 1B:
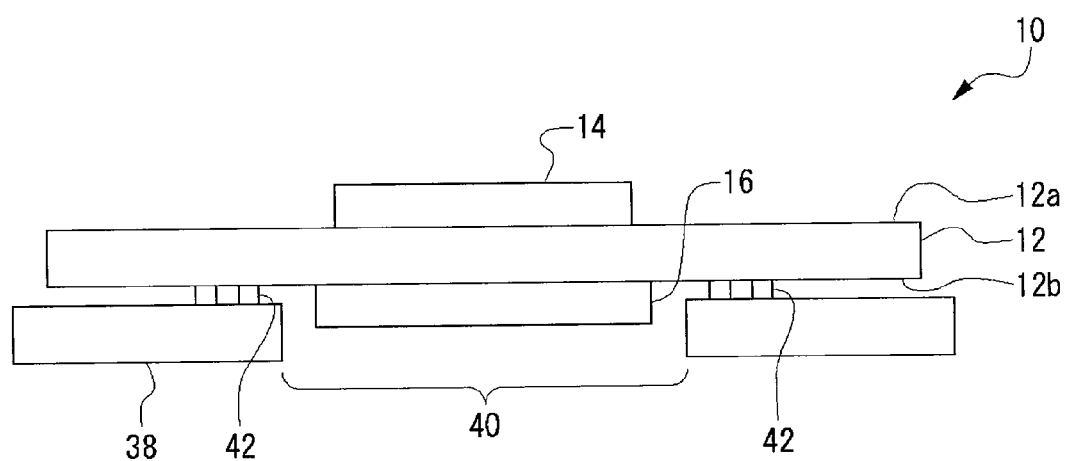
FIG. 1B is a cross-sectional view taken along line A-A' in FIG. 1A.
Figure 2:
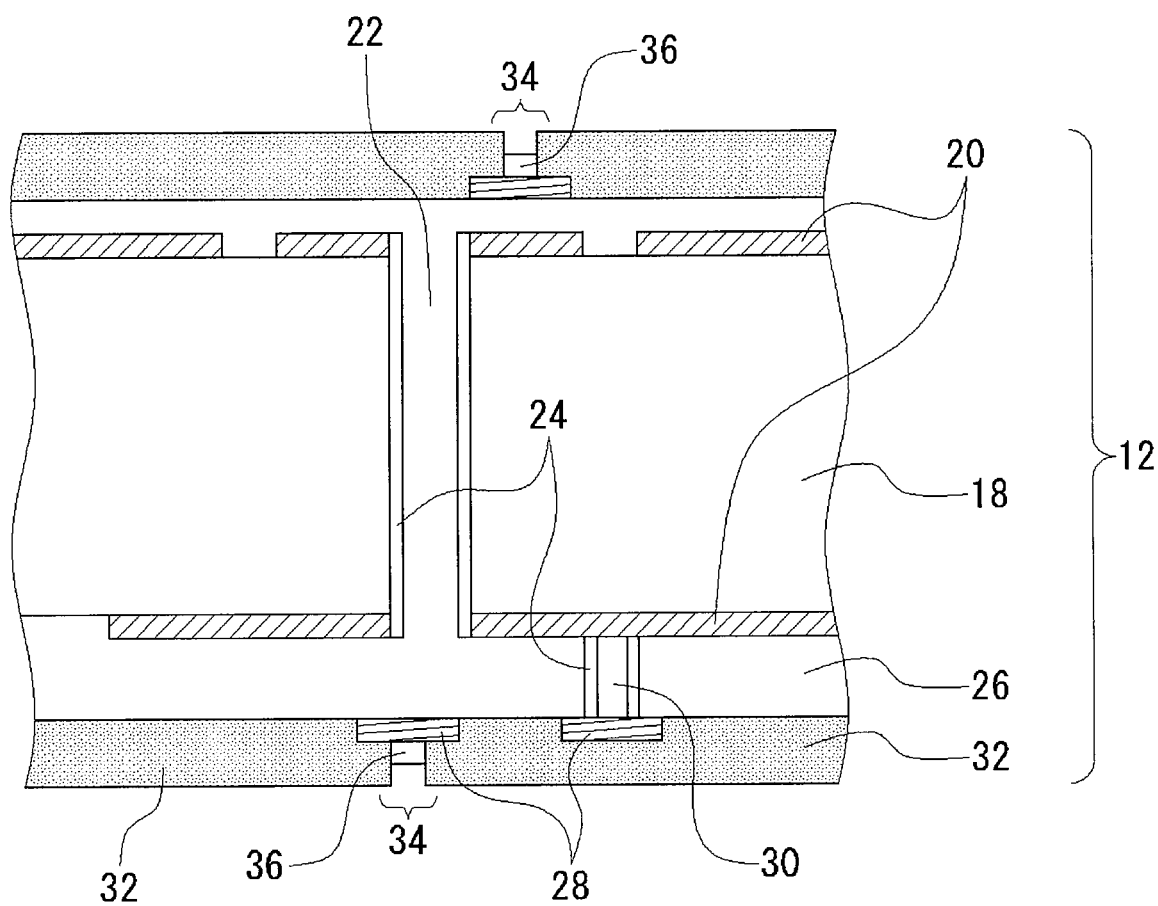
FIG. 2 is a cross-sectional view illustrating an example of a packaging board.

At first, the schematic structure of a semiconductor module according to a first embodiment will be described with reference to FIG. 1. FIG. 1A is a schematic top view schematically illustrating a main portion of the semiconductor module 10 according to the first embodiment. FIG. 1B is a cross-sectional view taken along line A-A' in FIG. 1A. FIG. 2 is a cross-sectional view illustrating an example of a packaging board.

The semiconductor module 10 comprises: a packaging board 12 having a wiring layer, on both surfaces of which devices are mounted; a first rectangular-shaped semiconductor device 14 mounted on one surface 12a of the packaging board 12; and a second rectangular-shaped semiconductor device 16 mounted on the other surface 12b of the packaging board 12.

In the packaging board 12, first wiring layers 20 made of Cu are formed on both surfaces of an insulating core member 18 made of, for example, a glass epoxy resin etc., as illustrated in FIG. 2. Herein, in order to electrically connect together the first wiring layers 20 formed on both surfaces of the core member 18 via the member 18, there is provided a first through-hole 22 at a predetermined position of the core member 18 by using a drill, etc. The side surface of the first through-hole 22 is plated with copper 24. The surfaces of the core member 18 and the first wiring layer 20 are covered with a first resin 26. In this case, the first resin 26 is also filled in the first through-hole 22.

There is further provided a patterned second wiring layer 28 on the surface of the first resin 26. In order to electrically connect the second wiring layer 28 and the first wiring layer 20 together, a second through-hole 30 is provided at a predetermined position of the first resin 26 by using an etching technique or a laser, etc. The side surface of the second through-hole 30 is plated with copper 24. The surfaces of the first resin 26 and the second wiring layer 28 are covered with a second resin 32. Further, an opening is provided at a predetermined position of the second wiring layer 28, the opening serving as an electrode 34. The surface of the electrode 34 is covered with a gold plate 36, thereby preventing oxidization or corrosion, etc. The packaging board 12 shall not be limited to such a structure, but may include a structure having two or more of wiring layers.

On the other hand, a plurality of solder bumps (not illustrated) are provided on the underside of the first semiconductor device 14 as external terminals, and the first semiconductor device 14 is mounted on the packaging board 12 in a state where each solder bump faces a corresponding electrode 34 of the packaging board 12. Likewise, a plurality of solder bumps (not illustrated) are provided on the underside of the second semiconductor device 16, and the second semiconductor device 16 is mounted on the packaging board 12 in a state where each solder bump faces a corresponding electrode 34 of the packaging board 12.

The semiconductor module 10 structured as stated above is mounted on a mother substrate 38. A cut-out portion 40 is formed in the mother substrate 38 such that the second semiconductor device 16 does not interfere with the mother substrate 38 when the semiconductor module 10 is mounted. The cut-out portion 40 is formed so as to be smaller than the circumference of the packaging board 12. Accordingly, the semiconductor module 10 is mounted on the mother substrate 38 in a way that the outer edge of the packaging board 12 is superimposed on the outer circumference of the cut-out portion 40. Electrical connection between the packaging board 12 and the mother substrate 38 in the semiconductor module 10 can be performed by, for example, connecting together the electrodes provided on both substrates with solder 42.

Figure 3A:
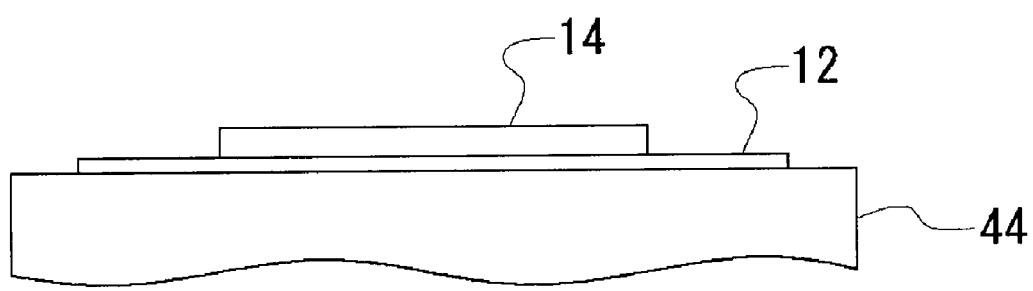
FIGS. 3A and 3B are views for illustrating a mounting method for mounting a semiconductor device according to the first embodiment.
Figure 3B:
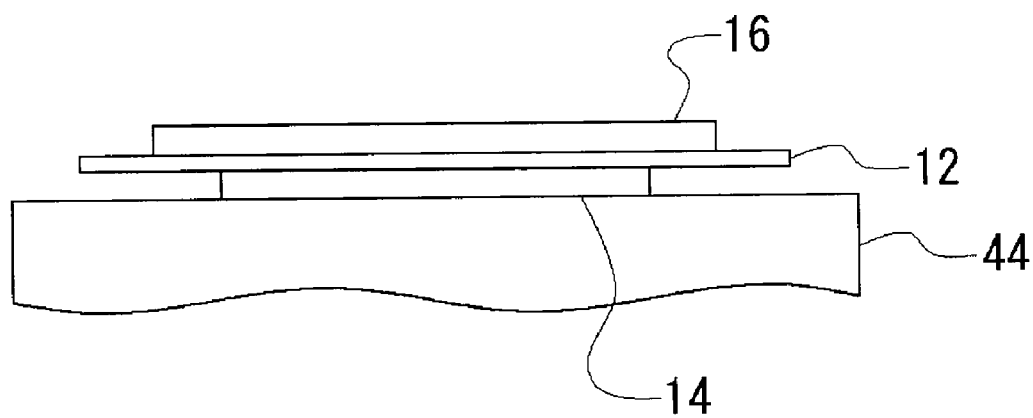

Subsequently, a mounting method for mounting a semiconductor device on the packaging board 12 by a reflow process, will be described. FIGS. 3A and 3B are views for illustrating the mounting method of the semiconductor device according to the first embodiment.

As illustrated in FIG. 3A, the packaging board 12 is at first fixed to an adhesive resin 44 in a state where the first semiconductor device 14 is temporarily fixed to the packaging board 12 via an uncalcined solder paste. When a reflow process is performed in this state, the aforementioned solder paste melts to connect the packaging board 12 and the first semiconductor device 14 together via a bump. At the time, the packaging board 12 does not warp due to a fixing power of the adhesive resin 44. In the reflow process according to the present embodiment, a temperature at which the solder paste melts is 220° C.

When the first semiconductor device 14 is mounted on the packaging board 12, the packaging board 12 is once cooled. And as illustrated in FIG. 3B, the packaging board 12 is fixed to the adhesive resin 44, with the first semiconductor device 14 located on the underside of the board 12. Thereafter, the reflow process is performed again in a state where the second semiconductor device 16 is temporarily mounted on the packaging board 12 via the uncalcined solder paste, allowing the packaging board 12 and the second semiconductor device 16 to be connected together. As stated above, in the second reflow process, there is a possibility that the packaging board 12 may deform because the packaging board 12 is not directly fixed to the adhesive resin 44. Further, the first semiconductor device 14 or the second semiconductor device 16 mounted on the packaging board 12, has a direction in which the warp of the packaging board 12 can be relatively suppressed and a direction in which that cannot be relatively suppressed, as long as the shape of the device 14 or 16 is not a perfect circle.

Figure 4:
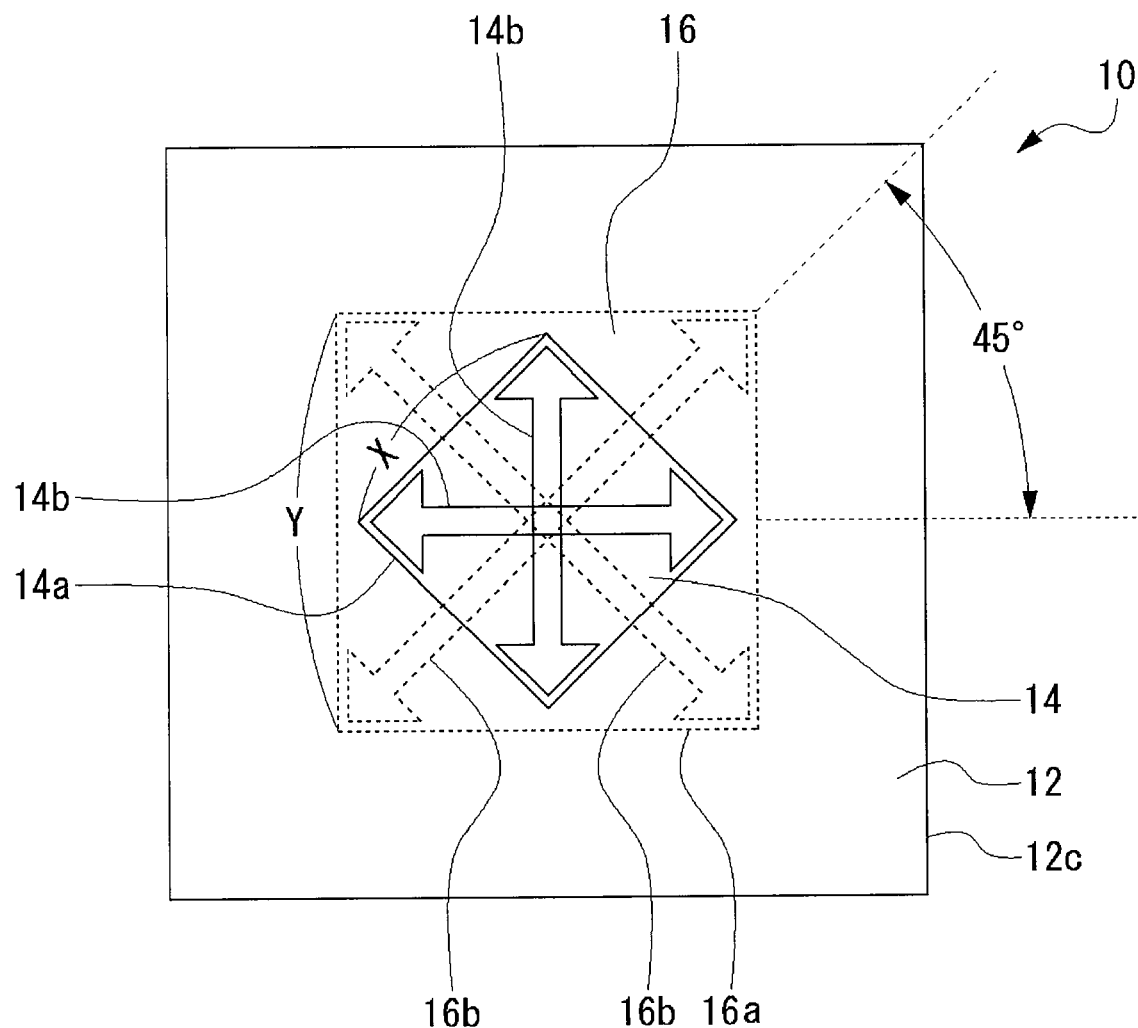
FIG. 4 is a view illustrating the directions in which the semiconductor module according to the first embodiment is not likely to warp.

Accordingly, the semiconductor module 10 according to the present embodiment is designed to reduce the directions in which the packaging board 12 is likely to deform, by devising arrangement between the first semiconductor device 14 and the second semiconductor device 16. Therefore, the arrangement of the first semiconductor device 14 and the second semiconductor device 16 relative to the packaging board 12, will be then described. FIG. 4 is a view illustrating the directions in which the semiconductor module 10 according to the first embodiment is not likely to warp.

As illustrated in FIG. 1, in the semiconductor module 10 according to the present embodiment, the first semiconductor device 14 has the square-shaped bottom surface (plane), each side of which has a length X, and the second semiconductor device 16 has that, each side of which has a length Y (Y>X). A mechanism by which the warp of the packaging board 12 is suppressed in the structure, will be described with reference to FIG. 4.

Because the first semiconductor device 14 according to the present embodiment is jointed to the packaging board 12 via the bumps arrayed in a grid pattern in an area of the underside of the device 14, the warp of the packaging board 12 can be suppressed. In particular, the warp of the packaging board 12 in the directions of the two diagonal lines 14b as illustrated in FIG. 4, can be suppressed. Further, the first semiconductor device 14 is arranged such that each side 14a thereof is not parallel to that 16a of the second semiconductor device 16, and that part or the whole of the first semiconductor device 14 is superimposed on the second semiconductor device 16, when seen from the direction perpendicular to the surface of the packaging board 12. In other words, the second semiconductor device 16 is arranged so as to be superimposed on the first semiconductor device 14 such that each side 16a of the second semiconductor device 16 is not parallel to that 14a of the first semiconductor device 14.

In the same way as the first semiconductor device 14, the second semiconductor device 16 is joined to the packaging board 12 via the bumps arrayed in a grid pattern in an area of the underside of the device 16 or via an adhesive, and hence the warp of the packaging board 12 can be suppressed. In particular, the warp of the packaging board 12 in the directions of the two diagonal lines 16b as illustrated in FIG. 4, can be suppressed.

As states above, because the first semiconductor device 14 is arranged such that each side 14a thereof is not parallel to that 16a of the second semiconductor device 16, two diagonal lines 14b of the first semiconductor device 14 are directed to the directions different from those 16b of the second semiconductor device 16. Therefore, the warp of the packaging board 12 in the directions of the diagonal lines 14b of the first semiconductor device 14 can be suppressed, in addition to the directions of the two diagonal lines 16b of the second semiconductor device 16, allowing the warp of the packaging board 12 in more directions to be suppressed.

In the semiconductor module 10 according to the present embodiment, an angle formed by line 14b of the first semiconductor device 14 and that 16b of the second semiconductor device 16 is approximately 45°. Accordingly, the warp of the packaging board 12 can be isotropically suppressed. The angle formed by the diagonal line 14b of the first semiconductor device 14 and that 16b of the second semiconductor device 16 does not need to be precisely 45°, but may be within the range of 40° to 50°. In the case, the warp of the packaging board 12 in various directions can be suppressed.

In the semiconductor module 10, the first semiconductor device 14 is arranged such that the diagonal line 14b thereof is parallel to one side 12c of the packaging board 12. Thereby, in the case where the packaging board 12 is rectangular-shaped, the warp of the packaging board 12 in the direction parallel to each side of the packaging board 12, can be suppressed. When each angle formed by the diagonal line 14b of the first semiconductor device 14 and that 16b of the second semiconductor device 16 is 45°, as in the semiconductor module 10, the warp of the packaging board 12 can be equally suppressed, in particular when the packaging board 12 is square-shaped. More preferably, the first semiconductor device 14 is arranged such that the center of gravity thereof and that of the second semiconductor device 16 are on the same axis line perpendicular to the surface of the packaging board 12. Further, more preferably, the packaging board 12 is arranged such that the center of gravity thereof and at least one of the centers of gravity of the first semiconductor device 14 and the second semiconductor device 16, are on the same axis line perpendicular to the surface of the packaging board 12. Thereby, the warp of the packaging board 12 can be suppressed more accurately.

Second Embodiment

Figure 5:
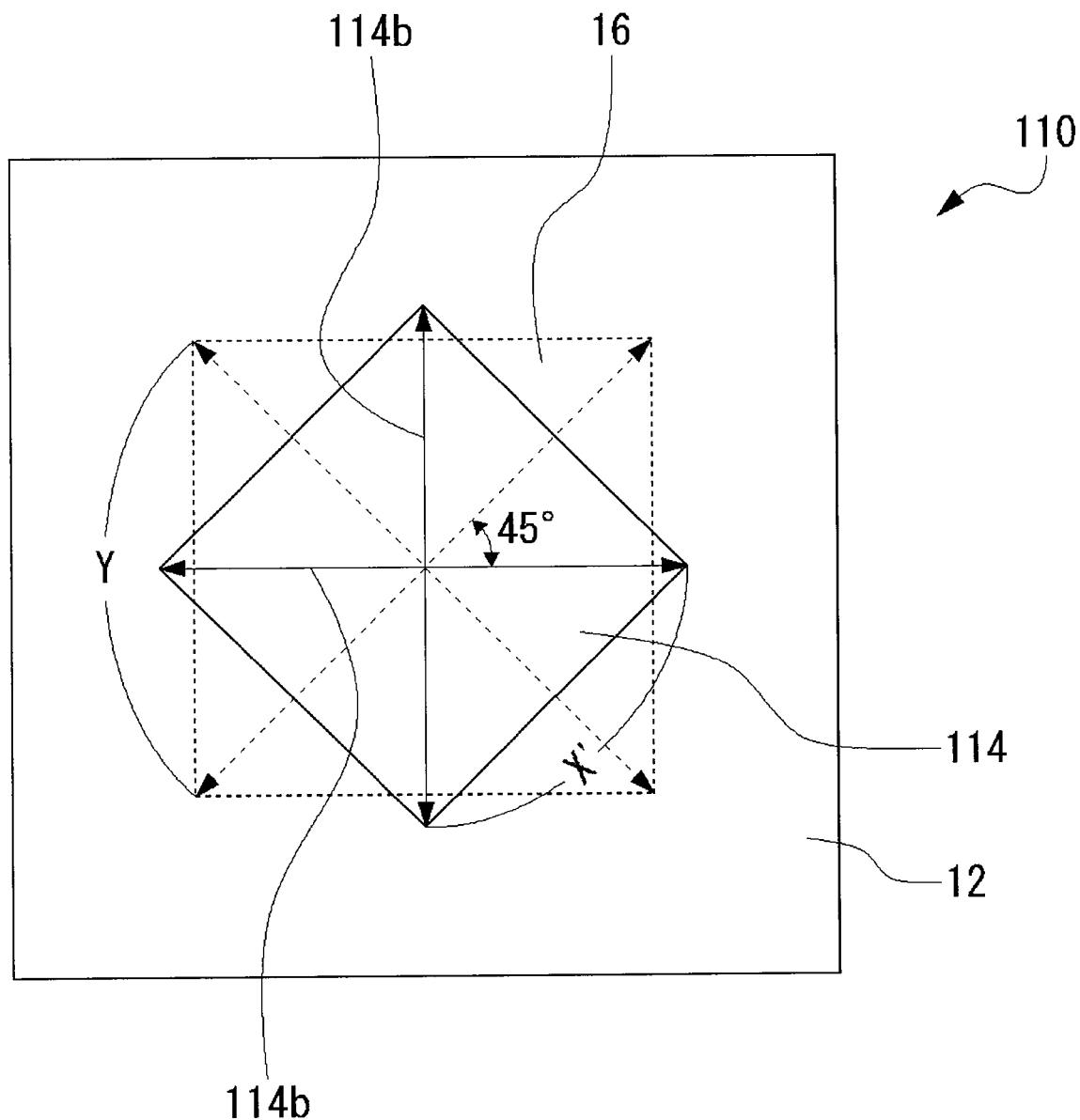
FIG. 5 is a view schematically illustrating the directions in which a semiconductor module according to a second embodiment is not likely to warp

FIG. 5 is a view schematically illustrating the directions in which a semiconductor module 110 according to a second embodiment is not likely to warp. The semiconductor module 110 according to the second embodiment mainly differs from the semiconductor module 10 according to the first embodiment, in that a ratio of the diagonal line of the first semiconductor device to one side of the second semiconductor device is different from that in the semiconductor module 10. Accordingly, the descriptions with respect to the same structures as the semiconductor module 10, such as the arrangement between the respective semiconductor devices and the angle formed by the diagonal lines thereof, will be appropriately omitted.

In the semiconductor module 110, the diagonal line 114b of the first semiconductor device 114 is larger than the length Y of one side of the second semiconductor device 16. That is, the length X' of one side of the first semiconductor device 114 satisfies $2^{1/2} \times X' > Y$. Thereby, the warp in the direction parallel to each side of the packaging board 12 can be more suppressed.

Third Embodiment

Figure 6A:
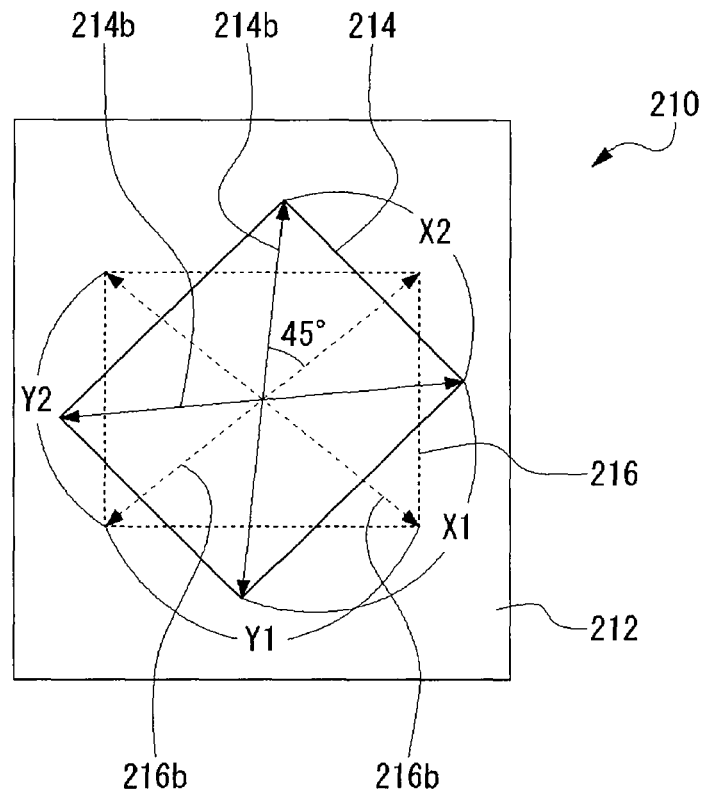
FIGS. 6A and 6B are views schematically illustrating the directions in which a semiconductor module according to a third embodiment is not likely to warp.
Figure 6B:
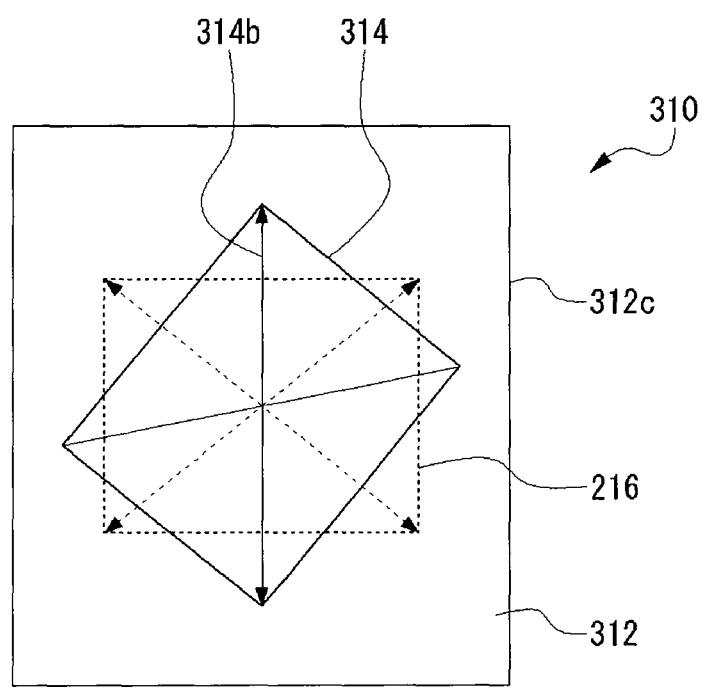

In the first and the second embodiments, the descriptions have been given to the case where each of the packaging board, the first semiconductor device and the second semiconductor device is square-shaped. However, of course, the aforementioned advantages can be obtained even when at least any one of the three is rectangular-shaped. FIGS. 6A and 6B are views schematically illustrating the directions in which a semiconductor module according to a third embodiment is not likely to warp.

In the semiconductor module 210 illustrated in FIG. 6A, a first semiconductor device 214 has the rectangular-shaped (X1>X2) bottom surface (plane), and a second semiconductor device 216 has the rectangular-shaped (Y1>Y2) bottom surface (plane). In the semiconductor module 210 according to the present embodiment, one of the angles formed by the diagonal lines 214b of the first semiconductor device 214 and the diagonal lines 216b of the second semiconductor device 216, is approximately 45°. Therefore, the warp of the packaging board 212 can be isotropically suppressed.

In a semiconductor module 310 illustrated in FIG. 6B, a first semiconductor device 314 is arranged such that one of the diagonal lines 314b thereof is parallel to one side 312c of a packaging board 312. Thereby, the warp of the packaging board 312 in the direction parallel to each side of the packaging board 312 can be suppressed, when the packaging board 312 is rectangular-shaped. In the present embodiment, the descriptions have been given to the case where each of the packaging board, the first semiconductor device and the second semiconductor device is rectangular-shaped; however, at least any one of them may be square-shaped.

Fourth Embodiment

Figure 7:
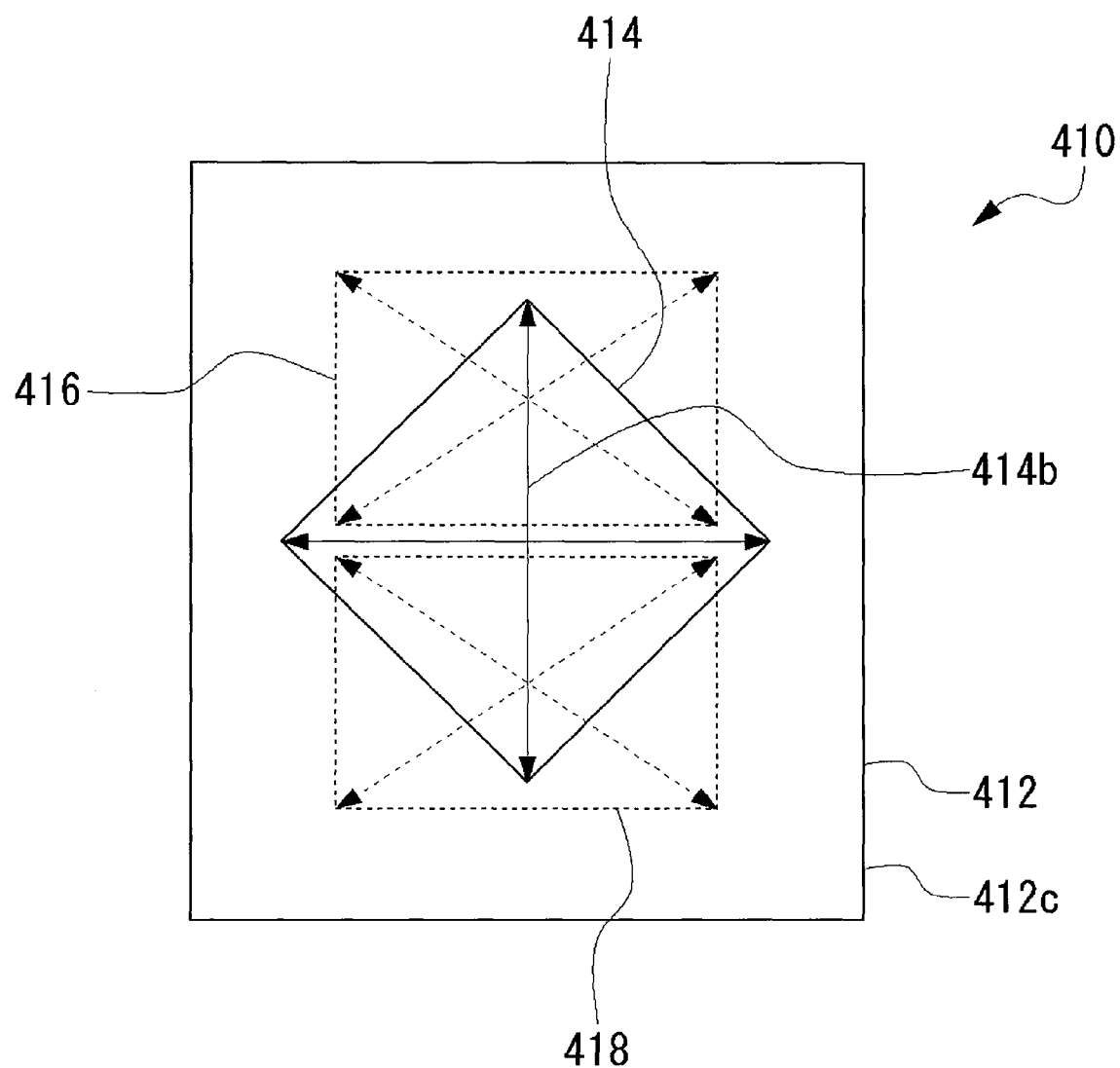
FIG. 7 is a view schematically illustrating the directions in which a semiconductor module according to a fourth embodiment is not likely to warp.

FIG. 7 is a view schematically illustrating the directions in which a semiconductor module 410 according to a fourth embodiment is not likely to warp. The semiconductor module 410 according to the fourth embodiment mainly differs from the semiconductor module 10 according to the first embodiment, in that a third semiconductor device is mounted on the surface located on the same side as the second semiconductor device. Accordingly, the same descriptions as the semiconductor module 10 will be appropriately omitted.

The semiconductor module 410 comprises: a packaging board 412 having a wiring layer, on both surfaces of which devices are mounted; a first square-shaped semiconductor device 414 mounted on one surface of the packaging board 412; a second rectangular-shaped semiconductor device 416 mounted on the other surface of the packaging board 412; and a third rectangular-shaped semiconductor device 418 mounted on the other surface of the packaging board 412 and mounted in parallel with the second semiconductor device 416.

The third semiconductor device 418 is arranged such that each side of the third semiconductor device is parallel to each corresponding side of the second semiconductor device 416, and that the semiconductor device 418 is superimposed on the first semiconductor device 414 when seen from the direction perpendicular to the surface of the packaging board 412. The first semiconductor device 414 is arranged such that the center of gravity thereof, and the center of gravity of the whole of the second semiconductor device 416 and the third semiconductor device 418, are on the same axis line perpendicular to the surface of the packaging board 412. More preferably, the packaging board 412 is arranged such that the center of gravity of the board 412, and at least one of the centers of gravity of the first semiconductor device 414 and the whole of the second semiconductor device 416 and the third semiconductor device 418, are on the same axis line perpendicular to the surface of the packaging board 412. Thereby, the warp of the packaging board 412 can be suppressed more accurately.

In the semiconductor module 410 illustrated in FIG. 7, the first semiconductor device 414 is arranged such that one of the diagonal lines 414b of the device 414 is parallel to one side 412c of the packaging board 412. Thereby, the warp of the packaging board 412 in the direction parallel to each side of the packaging board 412 can be suppressed when the packaging board 412 is rectangular-shaped. In the present embodiment, the descriptions have been given to the case where each of the second semiconductor device and the third semiconductor device is rectangular-shaped; however, at least either of the two may be square-shaped. Further, the first semiconductor device may be rectangular-shaped.

Fifth Embodiment

In each of the aforementioned embodiments, it has been shown that the warp of the packaging board in various directions can be suppressed by varying, equally to some extent, the directions of the respective diagonal lines of the semiconductor devices mounted on both surfaces of the packaging board, within the plane of the substrate. Further, in the present embodiment, the transmission quality of a signal through the wiring across the semiconductor devices mounted on both surfaces of the packaging board, can be improved by having the diagonal lines of the respective semiconductor devices directed to different directions. The principle thereof will be described below.

Figure 8A:
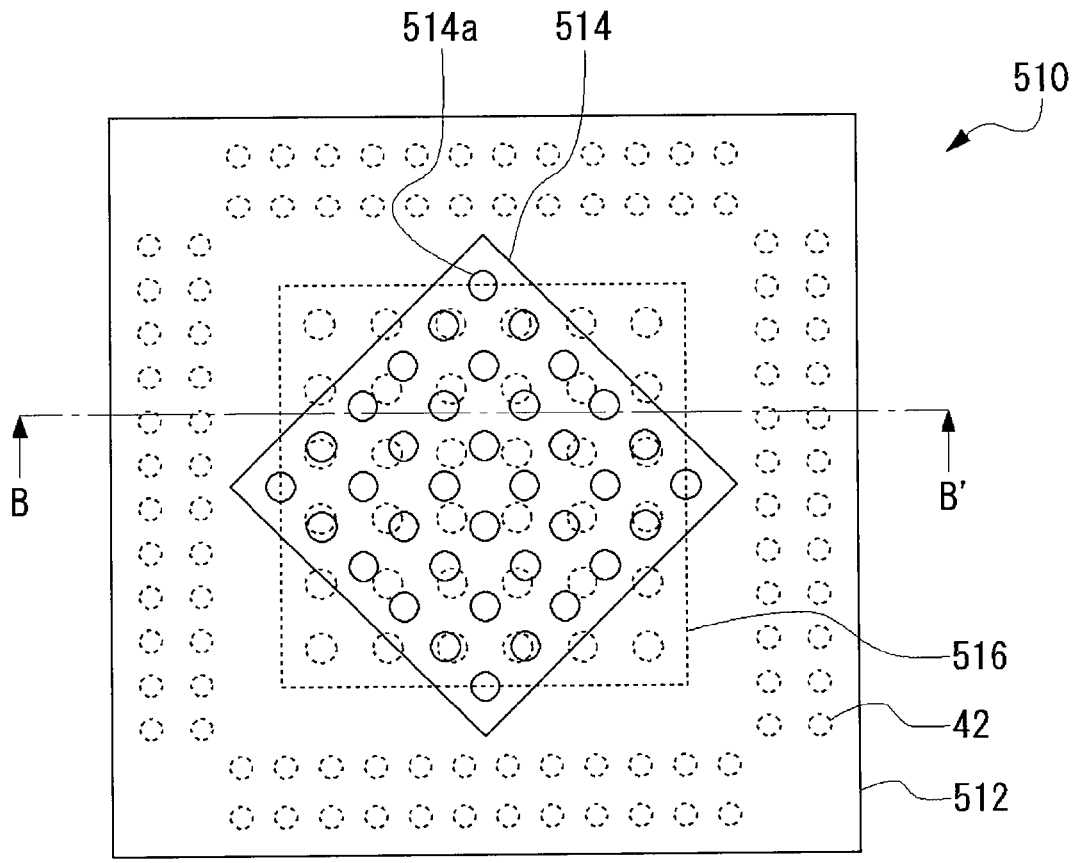
FIG. 8A is a schematic top view schematically illustrating a main portion of a semiconductor module according to a fifth embodiment.
Figure 8B:
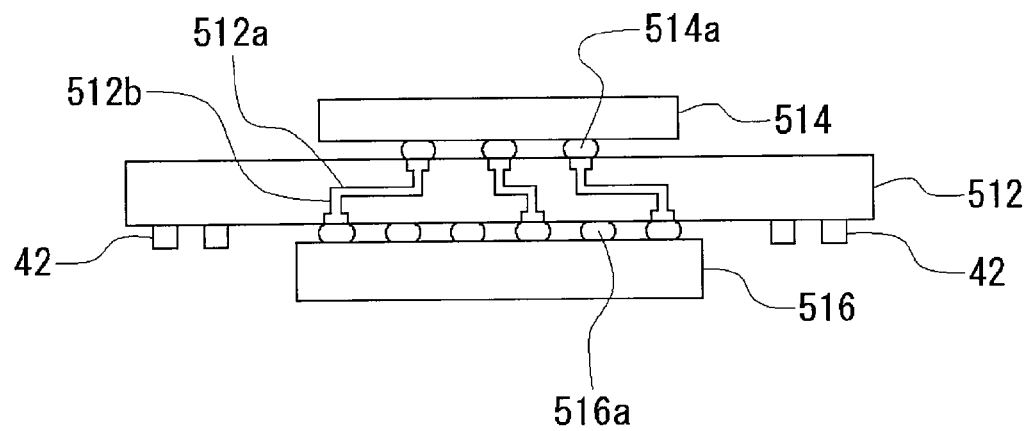
FIG. 8B is a cross-sectional view taken along line B-B' in FIG. 8A.

FIG. 8A is a schematic top view schematically illustrating n a main portion of a semiconductor module 510 according to a fifth embodiment. FIG. 8B is a cross-sectional view taken along line B-B' in FIG. 8A. In the fifth embodiment, the same structure as the semiconductor module 10 according to the first embodiment shall be denoted by the same reference numeral, and the description thereof will be appropriately omitted.

A first semiconductor device 514 is mounted on a packaging board 512 via 6×6 full grid of bumps 514a, arrayed in a regular lattice pattern on the surface facing a packaging board 512. Likewise, a second semiconductor device 516 is mounted on the packaging board 512 via 6×6 full grid of bumps 516a, arrayed in a regular lattice pattern on the surface facing the packaging board 512. Herein, the regular lattice pattern can be referred to as a state where each bump is arrayed such that the direction in which, when seen from a first bump, a second bump closest to the first bump is located, is parallel to one side of the semiconductor device. In other words, the regular lattice pattern can also be referred to as a state where external terminals such as bumps are arrayed in longitudinal and lateral directions so as to be parallel to four sides of the semiconductor device. The first semiconductor device 514 and the second semiconductor device 516 are electrically connected by the wiring 512a within the packaging board 512. More specifically, the bumps 514a and the bumps 516a are electrically connected via the wirings 512a within the packaging board 512. Such wiring 512a usually needs to be bent several times, in accordance with the relative position between the first semiconductor device 514 and the second semiconductor device 516 or the array of the bumps to be connected together. In the wiring thus bent, however, discontinuity of impedance occurs at the position where the wiring is bent, and hence a noise signal is generated by reflection, causing the transmission quality to be deteriorated. In particular, the problem becomes apparent as a signal is transmitted at a higher speed. Accordingly, the shape of the wiring is determined such that the discontinuity of impedance is caused as least as possible by bending the wiring at an obtuse angle.

Figure 9A:
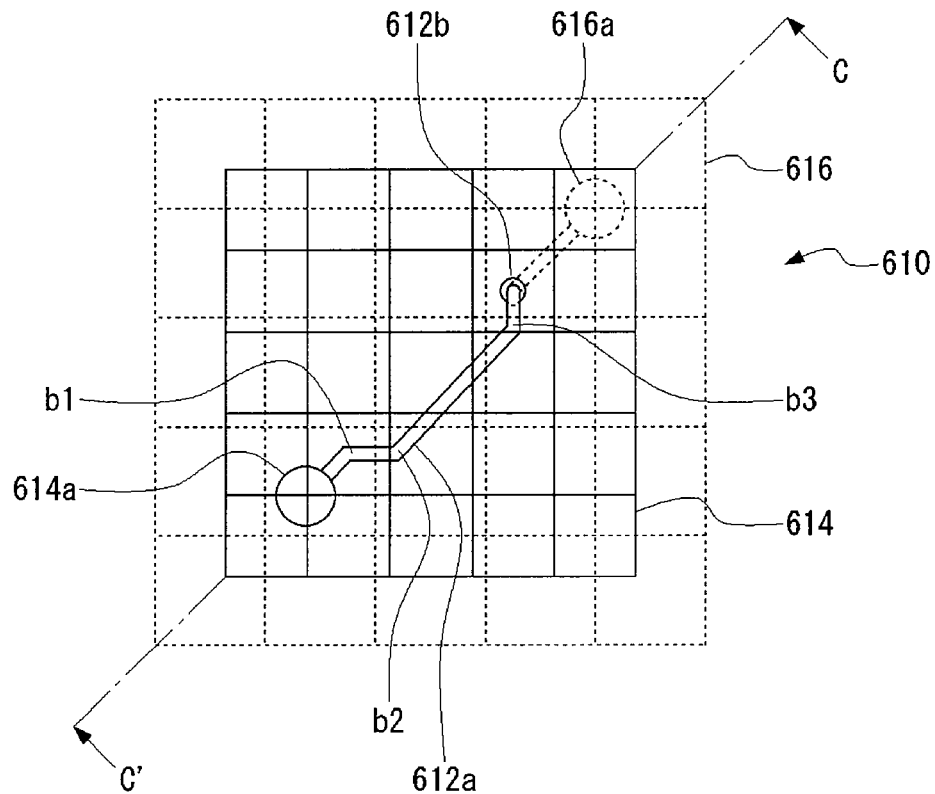
FIG. 9A is a schematic view illustrating a comparative example to describe bending of wiring electrically connecting semiconductor devices together.
Figure 9B:
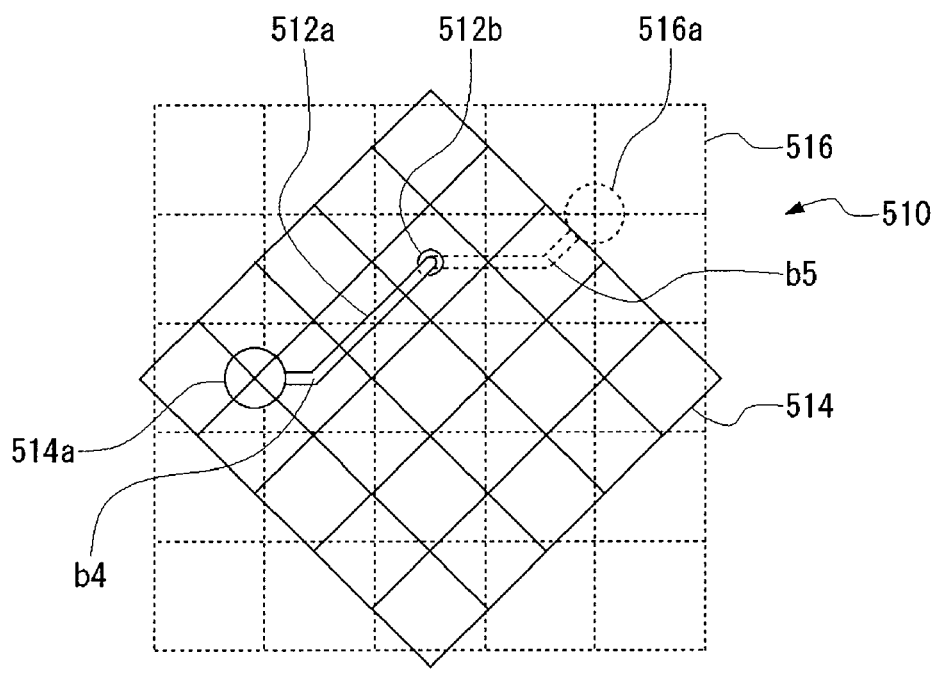
FIG. 9B is a schematic view illustrating bending of wiring in a semiconductor module 510 according to the present embodiment.
Figure 10:
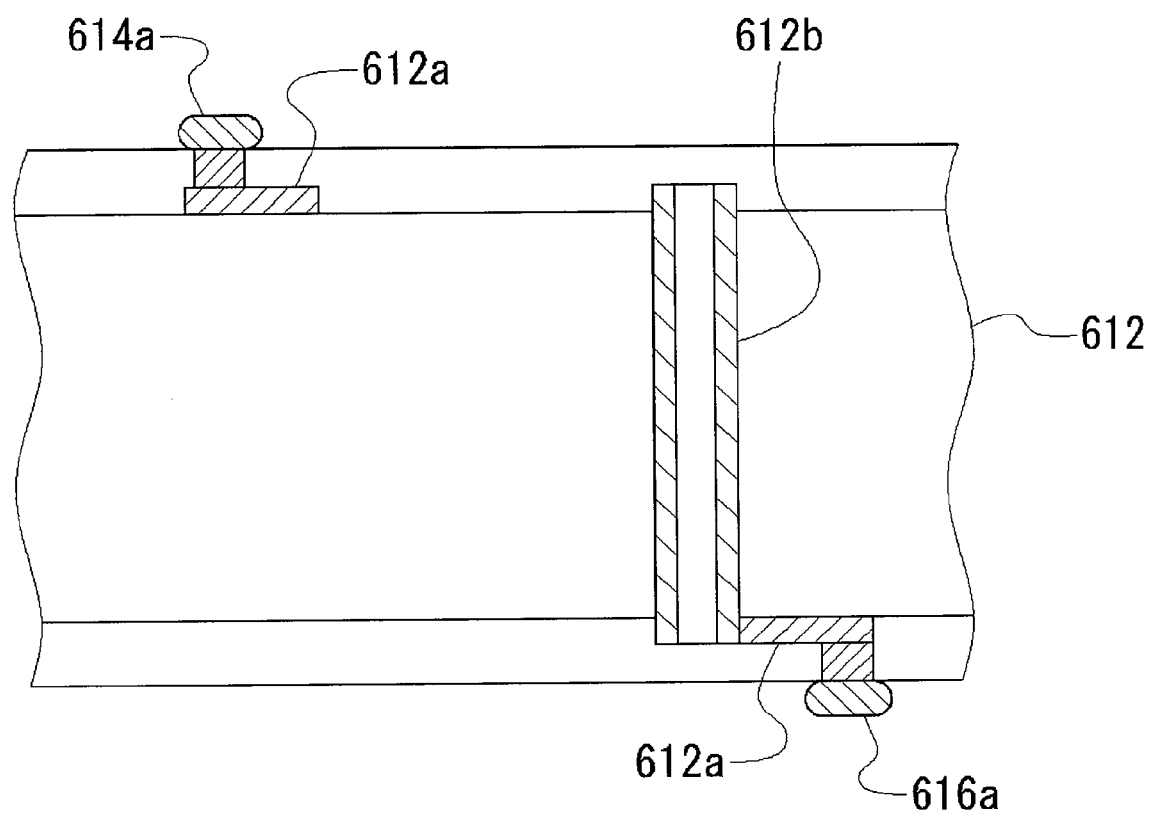
FIG. 10 is a cross-sectional view taken along line C-C' in FIG. 9A.

FIG. 9A is a schematic view illustrating a comparative example to describe bending of the wiring electrically connecting semiconductor devices together. FIG. 9B is a schematic view illustrating bending of the wiring in the semiconductor module 510 according to the present embodiment. FIG. 10 is a cross-sectional view taken along line C-C' in FIG. 9A.

A semiconductor module 610 illustrated in FIG. 9A comprises: a packaging board 612 (see FIG. 10); a first semiconductor device 614, the bumps 614a of which are arranged at the respective intersecting points of continuous lines that are arrayed on the top surface of the packaging board 612 and arrayed in a grid pattern; and a second semiconductor device 616, the bumps 616a of which are arranged at the respective intersecting points of continuous lines that are arrayed on the underside of the packaging board 612 and arrayed in a grid pattern. For convenience of description, in FIG. 9A, a core member of the packaging board 612 is omitted, and the wiring 612a and a via 612b are only illustrated. Hereinafter, descriptions will be given to the case where the wiring layer of the packaging board 612 has two layers; however, of course, the wiring layer may have more than two layers.

The wiring 612a needs to be designed so as not to connect the bumps of the same semiconductor device together. In the bump arrangement illustrated in FIG. 9A, the wiring 612a is bent so as to have obtuse angles at three positions of bending portions b1, b2 and b3. The bending between the wiring 612a and the via 612b is not counted herein, because the bending is performed in the direction perpendicular to the surface of the packaging board.

On the other hand, in the semiconductor module 510 according to the fifth embodiment illustrated in FIG. 9B, the first semiconductor device 514 is mounted on the packaging board 512 in a state where the diagonal line of the device 514 is shifted by 45° relative to that of the second semiconductor device 516, in comparison with a semiconductor module 610 illustrated as a comparative example. Therefore, in the case of the bump arrangement illustrated in FIG. 9B, the bump 514a and the bump 516a can be connected together only by bending the wiring 512a so as to have obtuse angles at two positions of the bending portions b4 and b5. Bending between the wiring 512a and the via 512b is not counted herein, because the bending is performed in the direction perpendicular to the surface of the packaging board. As stated above, in the semiconductor module 510 according to the present embodiment, the bump 514a and the bump 516a are arrayed in the directions different from each other, and hence the number of the bending portions of the wiring 512a can be reduced. As a result, the transmission quality of a signal in the semiconductor module 510 can be improved.

Subsequently, descriptions will be made with respect to the case where the packaging board 512 includes differential pair wiring transmitting differential signals. With the increased high-speed in signal processing or signal transmission, etc., in semiconductor modules used for electronic devices, a differential transmission method has been adopted as a data transmission method, replacing the conventional single end method. In the differential transmission method, a positive-phase signal and a negative-phase signal are generated from a single signal to transmit the signals by using two signal lines. In this method, the signal lines for the positive-phase signal and the negative-phase signal are electromagnetically combined together, and hence the signal lines for the two phases have, with each other, the relationship between a signal current path and a return current path. Therefore, emission of electromagnetic noises and influence by extraneous electromagnetic noises can be reduced, in comparison with the conventional single end transmission method.

On the other hand, when the signal lines transmitting differential signals are used in an actual packaging board, it is needed that the two whole transmission paths including the signal lines are designed to have the same length as each other, as much as possible, to secure electrical equivalence between the positive-phase signal and the negative-phase signal within the differential pair wiring. If the line lengths of the two signal lines are greatly different from each other in a packaging board, mismatching of impedance occurs due to this. Therefore, there is a possibility that a reflected noise may be generated to cause a malfunction in the semiconductor device on the packaging board.

Figure 11A:
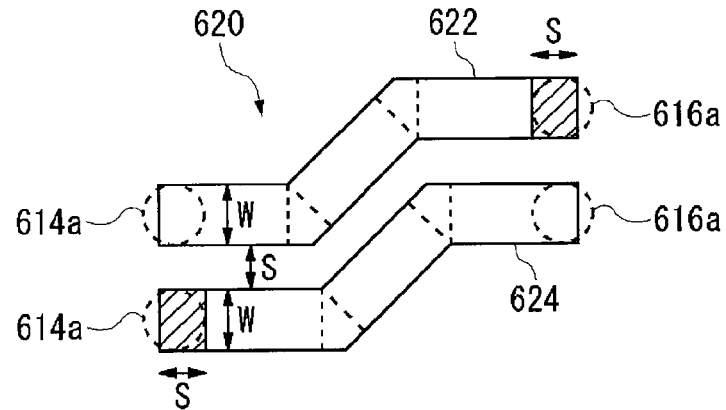
FIG. 11A is a view illustrating an example of the shape of differential pair wiring in the comparative example illustrated in FIG. 9A.
Figure 11B:
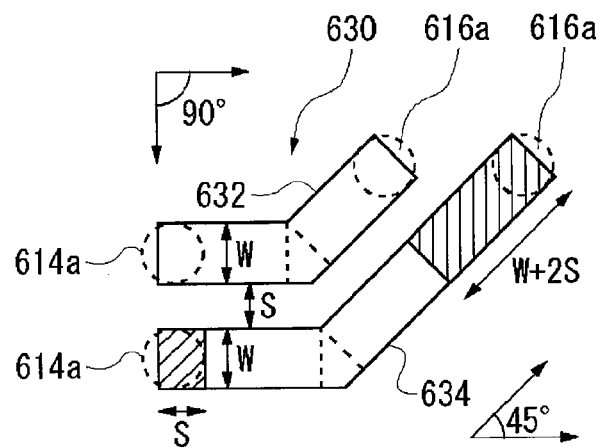
FIG. 11B is a view illustrating another example of the shape of the differential pair wiring in the comparative example illustrated in FIG. 9A.
Figure 11C:
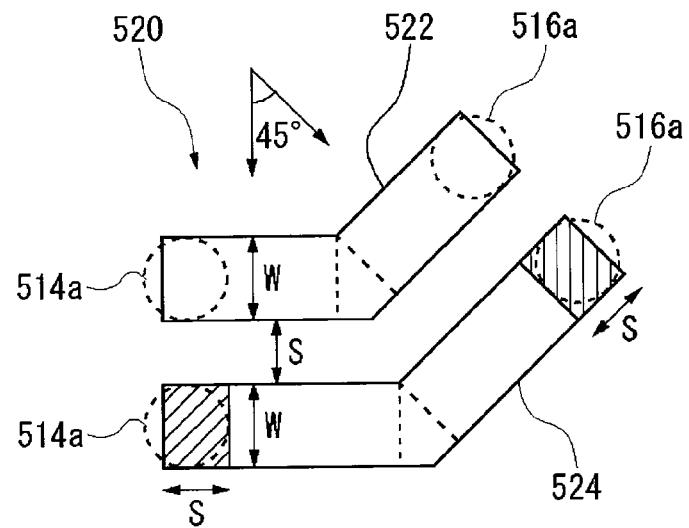
FIG. 11C is a view illustrating the shape of the differential pair wiring according to the present embodiment.

FIG. 11A is a view illustrating an example of the shape of the differential pair wiring in the comparative example illustrated in FIG. 9A. FIG. 11B is a view illustrating another example of the shape of the differential pair wiring in the comparative example illustrated in FIG. 9A. FIG. 11C is a view illustrating the shape of the differential pair wiring according to the present embodiment.

Hereinafter, descriptions will be given to the case where an interval between the bumps of the first semiconductor device and that of the second semiconductor device, which are according to the present embodiment, are the same as each other, for simplification of the descriptions. In the differential pair wiring 620 illustrated in FIG. 11A, two wiring 622 and 624 having a line width W are arranged so as to be spaced a wiring interval S apart from each other. Two bumps 614a of the first semiconductor device 614 and those 616a of the second semiconductor device 616 are respectively connected by the wiring 622 and 624 of the differential pair wiring 620. Herein, the direction in which the two bumps 614a illustrated in FIG. 11A are arrayed (the direction in which the bumps closest to each other are linked together) is parallel to that in which the two bumps 616a are arrayed.

Accordingly, each of the wiring 622 and the wiring 624 has two bending positions, and has the same wire length as each other. Therefore, in the differential pair wiring 620, signals can be transmitted by the two signal lines having the same length as each other; however, because the discontinuity of impedance occurs at the bending positions, there is room for further improvement with respect to the reflected noise signal.

On the other hand, in differential pair wiring 630 illustrated in FIG. 11B, two wiring 632 and 634 having a line width W are arranged so as to be spaced a wiring interval S apart from each other. Two bumps 614a of the first semiconductor device 614 and those 616a of the second semiconductor device 616 are respectively connected by wiring 632 and 634 of the differential pair wiring 630. Herein, the direction in which the two bumps 614a illustrated in FIG. 11B are arrayed is perpendicular to that in which the two bumps 616a are arrayed.

Accordingly, each of the wiring 632 and the wiring 634 has a single bending position, and a difference between the wire lengths is $S+(W+2S)=W+3S$. Therefore, in the differential pair wiring 630, the difference between the wire lengths becomes large in comparison with the aforementioned differential pair wiring 620, although the number of the bending positions is reduced, and hence mismatching of impedance becomes large.

As illustrated in FIG. 9B, in the case of the semiconductor module 510 in which the direction in which the bumps 514a of the first semiconductor device 514 are arrayed is shifted by 45° from that in which the bumps 516a of the second semiconductor device 516 are arrayed, good transmission property can be obtained by using the differential pair wiring 520 illustrated in FIG. 11C. Specifically, in the differential pair wiring 520 illustrated in FIG. 11C, two wiring 522 and 524 having a line width W are arranged so as to be spaced a wiring interval S apart from each other. Two bumps 514a of the first semiconductor device 514 and those 516a of the second semiconductor device 516 are respectively connected via the wiring 522 and 524 of the differential pair wiring 520. Herein, the direction in which the two bumps 514a illustrated in FIG. 11C are arrayed is shifted by 45° from that in which the two bumps 516a are arrayed.

Accordingly, each of the wiring 522 and the wiring 524 has a single bending position, allowing the number of the bending positions to be reduced in comparison with the aforementioned differential pair wiring 620. Further, a difference between the wire lengths of the wiring 52 and the wiring 524 is $S+S=2S$, allowing the difference of the wire lengths to be reduced, in comparison with the aforementioned differential pair wiring 630. Therefore, in the semiconductor module 510 having the differential pair wiring 520, a malfunction of the first semiconductor device 514 or the second semiconductor device 516 can be more prevented.

Sixth Embodiment

Figure 12:
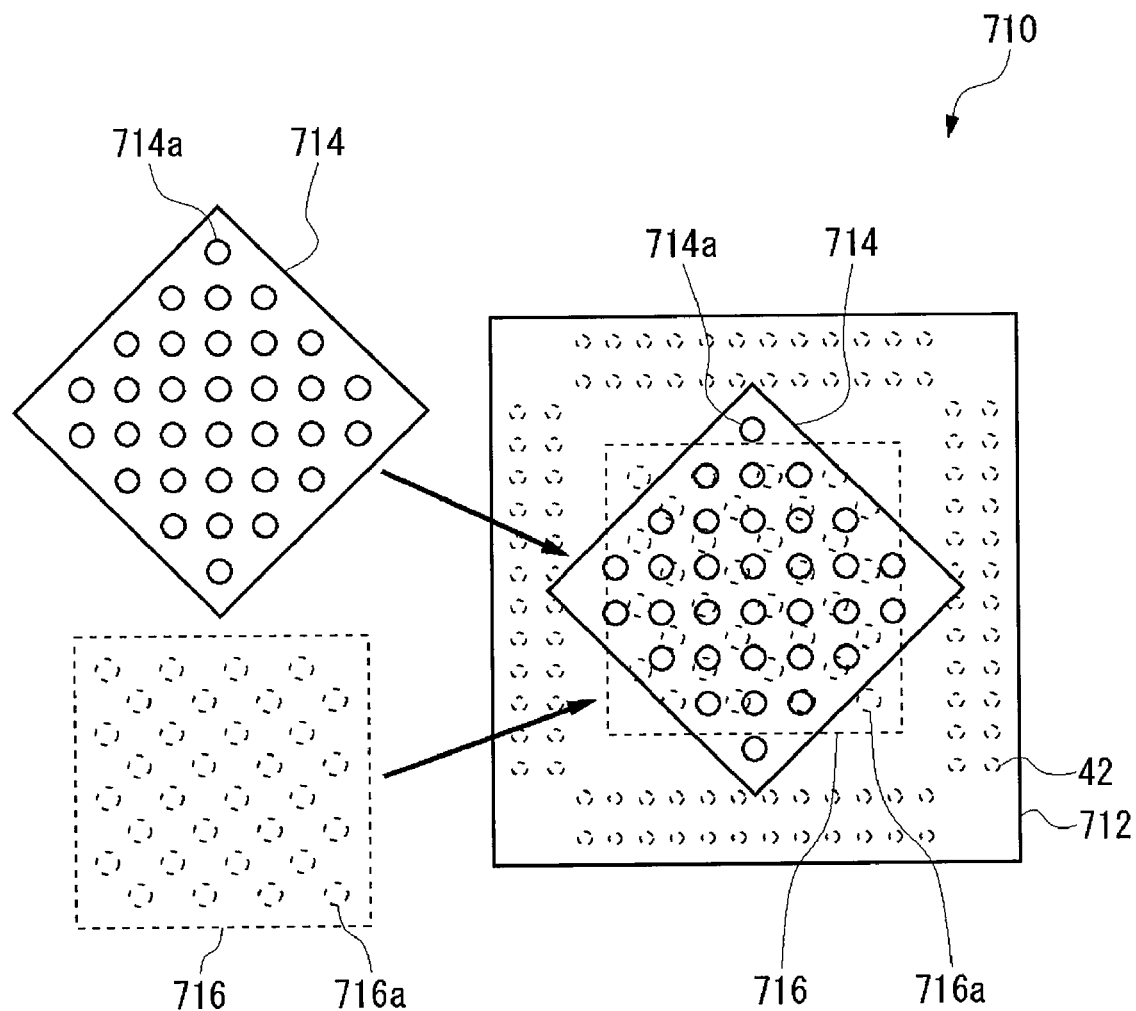
FIG. 12 is a schematic top view schematically illustrating a main portion of a semiconductor module according to a sixth embodiment.

In the semiconductor module 510 according to the aforementioned embodiments, the bumps of each of the first semiconductor device 514 and the second semiconductor device 516 are arrayed in a regular lattice pattern; however, the pattern in which the bumps are arrayed shall not be limited thereto, but may be arrayed, for example, in a houndstooth check pattern. FIG. 12 is a schematic top view schematically illustrating a main portion of a semiconductor module 710 according to a sixth embodiment.

A first semiconductor device 714 is mounted on a packaging board 712 via bumps 714a arrayed on the surface facing the packaging board 712 and arrayed in a houndstooth check pattern. Likewise, a second semiconductor device 716 is mounted on the packaging board 712 via bumps 716a arrayed on the surface facing the packaging board 712 and arrayed in a houndstooth check pattern. Herein, the houndstooth check pattern can be referred to as a state where each bump is arrayed such that the direction in which, when seen from a first bump, a second bump closest to the first bump is located, is parallel to the diagonal line of the semiconductor device. In other words, the houndstooth check pattern can also be referred to as a state where external terminals such as bumps are arrayed in longitudinal and lateral directions so as to be parallel to the diagonal lines of the semiconductor device. The first semiconductor device 714 and the second semiconductor device 716 are electrically connected by the wiring (not illustrated) within the packaging board 712. As stated above, even when the semiconductor devices, the bumps of which are arrayed in a houndstooth check pattern, are mounted on both surfaces of the packaging board, the same advantages as in the aforementioned embodiments can be obtained.

Seventh Embodiment

Figure 13A:
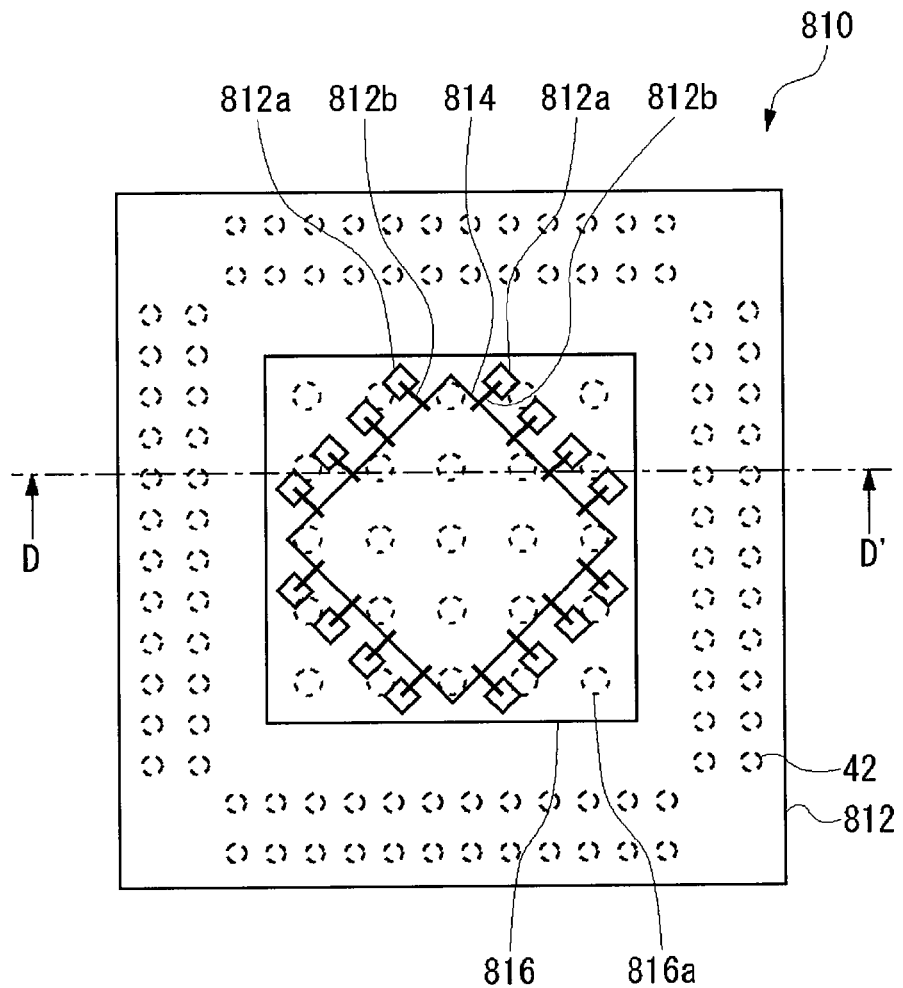
FIG. 13A is a schematic top view schematically illustrating a main portion of a semiconductor module according to a seventh embodiment.
Figure 13B:
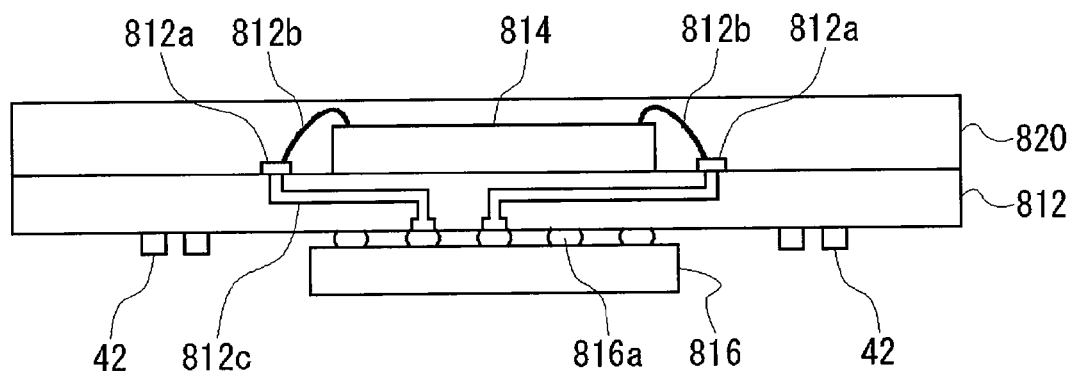
FIG. 13B is a cross-sectional view taken along line D-D' in FIG. 13A.

In the aforementioned embodiments, the descriptions have been given to the case of the semiconductor module in which the two semiconductor devices and the packaging board are connected via the bumps. In the present embodiment, descriptions will be made with respect to a semiconductor module in which at least one of a plurality of semiconductor devices to be mounted, and a packaging board are connected by wire bonding. FIG. 13A is a schematic top view schematically illustrating a main portion of a semiconductor module 810 according to a seventh embodiment. FIG. 13B is a cross-sectional view taken along line D-D' in FIG. 13A. In the seventh embodiment, the same structure as the semiconductor module 10 according to the first embodiment shall be denoted by the same reference numeral, and the description thereof will be appropriately omitted.

A first semiconductor device 814 is fixed to the top surface of a packaging board 812 via a not-illustrated adhesion layer. In the packaging board 812, a plurality of electrode pads 812a are provided on the top surface thereof such that the pads 812a surround four sides of the first semiconductor device 814. The first semiconductor device 814 and the plurality of electrode pads 812a are connected together by a plurality of conductive bonding wires 812b. The first semiconductor device 814 is sealed by a resin mold 820. On the other hand, the second semiconductor device 816 is mounted on the packaging board 812 via 5×5 full grid of bumps 816a, arrayed on the surface facing the packaging board 812 and arrayed in the regular lattice pattern. The first semiconductor device 814 and the second semiconductor device 816 are electrically connected by the wiring 812c within the packaging board 812. More specifically, the electrode pads 812a and the bumps 816a are electrically connected together via the wiring 512a within the packaging board 512. As stated above, by directly fixing the semiconductor device to the packaging board without a gap via the adhesion layer, the warp of the packaging board can be more suppressed than the case where the semiconductor device is connected to the packaging board via the bumps.

Eighth Embodiment

Subsequently, descriptions will be made with respect to a mobile device provided with the semiconductor module according to each of the aforementioned embodiments. An example in which the semiconductor module is mounted on a cell phone as the mobile device, will be shown; however, the mobile device may be an electronic device including, for example, a Personal Digital Assistant (PDA), a digital camcorder (DVC), and a digital still camera (DSC).

Figure 14:
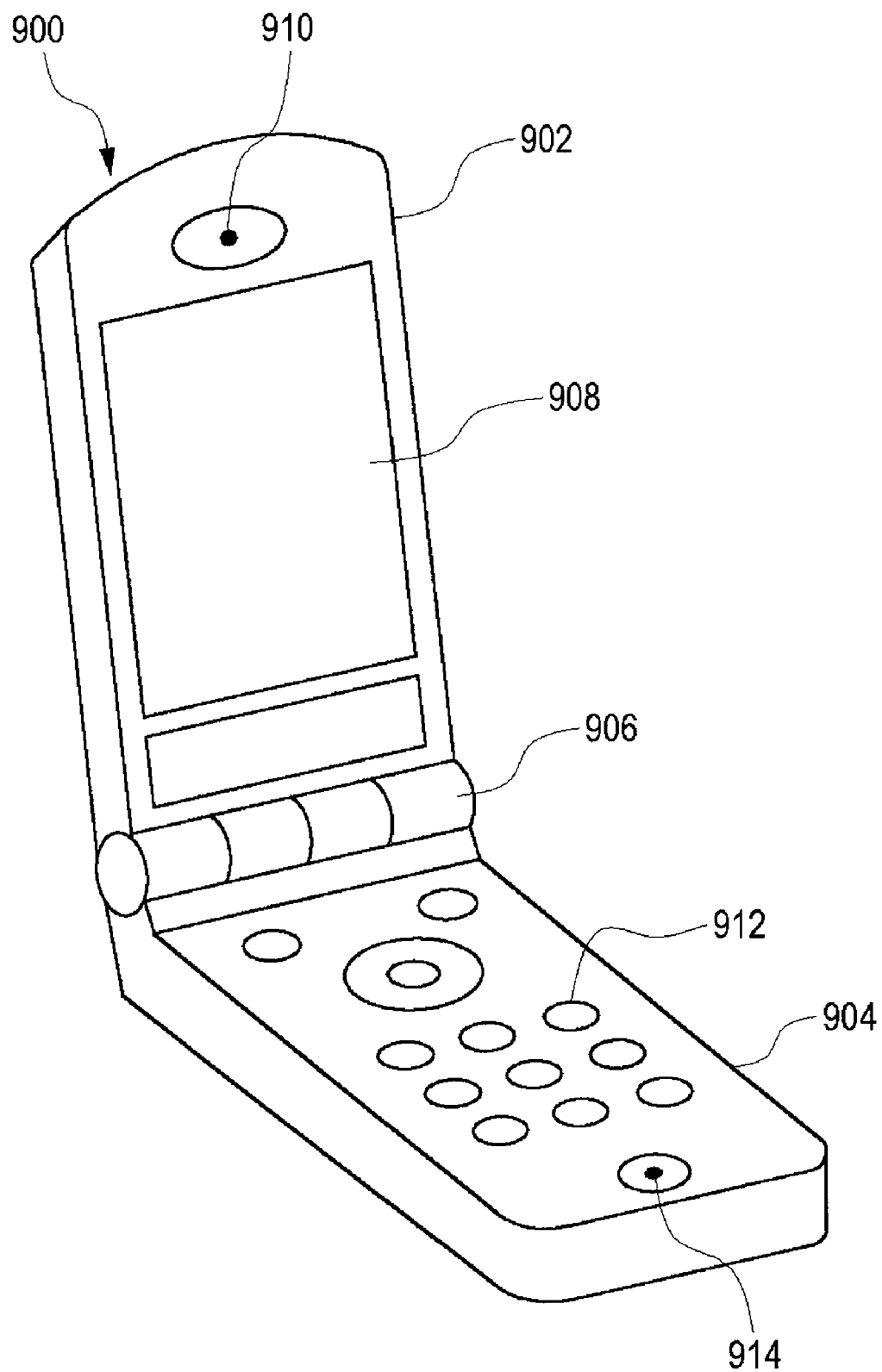
FIG. 14 is a view illustrating the structure of a cell phone according to an eighth embodiment.

FIG. 14 is a view illustrating the structure of a cell phone provided with the semiconductor module according to each of the aforementioned embodiments. A cell phone 900 is structured such that a first housing 902 and a second housing 904 are connected via a movable part 906. The first housing 902 and the second housing 904 are movable around the movable part 906. The first housing 902 is provided with a display unit 908 for displaying information including characters and images, and with a speaker unit 910. The second housing 904 is provided with an operation unit 912 (e.g. operation buttons) and a microphone unit 914. The semiconductor module according to each of the aforementioned embodiments is mounted inside the cell phone 900 thus structured.

Figure 15:
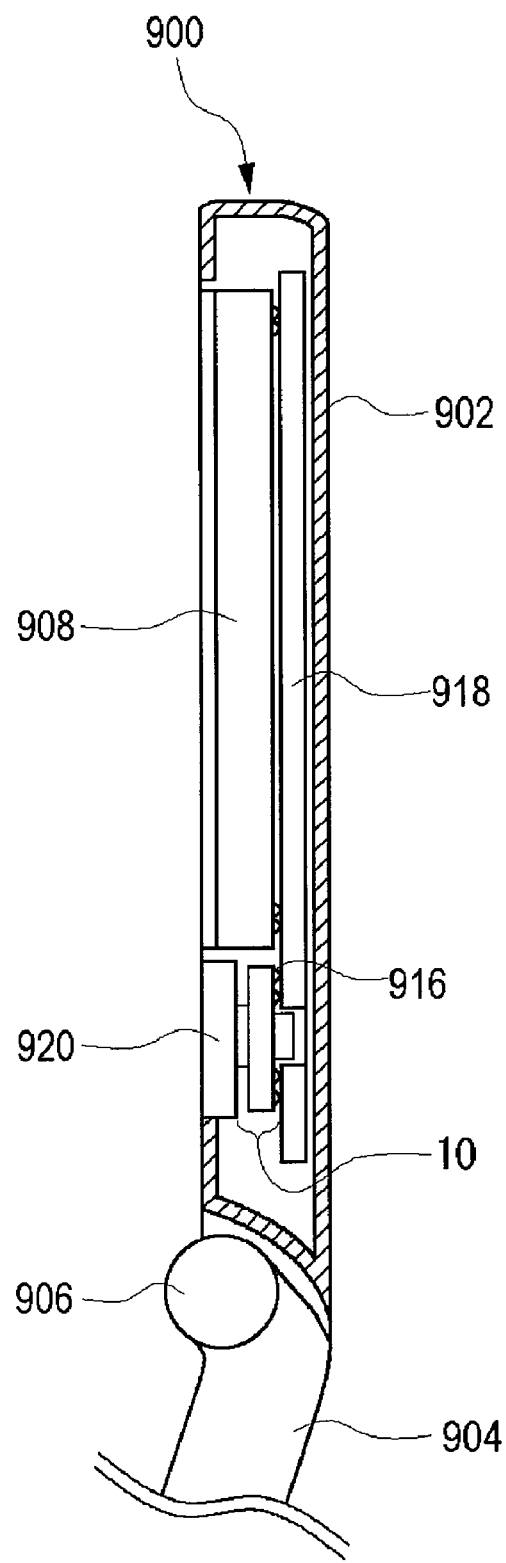
FIG. 15 is a partial cross-sectional view of the cell phone illustrated in FIG. 14.

FIG. 15 is a partial cross-sectional view of the cell phone illustrated in FIG. 14 (section of the first housing 902). The semiconductor module 10 according to the aforementioned embodiments is mounted on a printed board 918 via an solder bump 916 to be electrically connected with the display unit 908 via the printed board 918. The underside of the semiconductor module 10 (the surface opposite to the solder bump 916) is provided with a heat spreader 920 such as a metal plate. For example, heat generated by the semiconductor module is prevented from collected inside the first housing 902 and is released outside the first housing 902 efficiently.

The present invention has been described above with reference to each of the aforementioned embodiments. However, the present invention shall not be limited to the above embodiments, but variations in which the structures of the respective embodiments are appropriately combined or replaced, are also within the scope of the present invention. The order of producing the semiconductor module in the respective embodiments could be appropriately changed, or various modifications such as design modification could be made to the respective embodiments in circuit devices or semiconductor devices, based on the knowledge of a skilled person. Such modifications could be also within the scope of the present invention.

For example, each of the first semiconductor device and the second semiconductor device may be joined to the packaging board by wire bonding.

What is claimed is:

1. A semiconductor module comprising:
   a substrate configured to have a wiring layer;
   a first rectangular-shaped semiconductor device configured to be mounted on one surface of the substrate; and
   a second rectangular-shaped semiconductor device configured to be mounted on the other surface of the substrate,
   wherein the first semiconductor device is arranged such that each side of the first semiconductor device is not parallel to that of the second semiconductor device, and that the first semiconductor device is superimposed on the second semiconductor device, when seen from the direction perpendicular to the surface of the substrate.

2. The semiconductor module according to claim 1, wherein the first semiconductor device is arranged such that an angle formed by the diagonal line of the first semiconductor device and that of the second semiconductor device is 45°.

3. The semiconductor module according to claim 1, wherein the first semiconductor device is arranged such that the diagonal line of the first semiconductor device is parallel to one side of the substrate.

4. The semiconductor module according to claim 1, wherein the substrate is rectangular-shaped.

5. The semiconductor module according to claim 4, wherein the substrate is square-shaped.

6. The semiconductor module according to claim 1, wherein the first semiconductor device is square-shaped.

7. The semiconductor module according to claim 1, wherein the second semiconductor device is square-shaped.

8. The semiconductor module according to claim 1, wherein the first semiconductor device is arranged such that the center of gravity of the first semiconductor device and that of the second semiconductor device are on the same axis line perpendicular to the surface of the substrate.

9. The semiconductor module according to claim 1, wherein the substrate is arranged such that the center of gravity of the substrate and at least one of the centers of gravity of the first semiconductor device and the second semiconductor device, are on the same axis line perpendicular to the surface of the substrate.

10. The semiconductor module according to claim 1, further comprising a third rectangular-shaped semiconductor device configured to be mounted on the other surface of the substrate, wherein the third semiconductor device is arranged such that each side of the third semiconductor device is parallel to each corresponding side of the second semiconductor device, and that the third semiconductor device is superimposed on the first semiconductor device when seen from the direction perpendicular to the surface of the substrate.

11. The semiconductor module according to claim 10, wherein the first semiconductor device is arranged such that the center of gravity of the first semiconductor device, and the center of gravity of the whole of the second semiconductor device and the third semiconductor device, are on the same axis line perpendicular to the surface of the substrate.

12. The semiconductor module according to claim 10, wherein the substrate is arranged such that the center of gravity of the substrate, and at least one of the centers of gravity of the first semiconductor device and the whole of the second semiconductor device and the third semiconductor device, are on the same axis line perpendicular to the surface of the substrate.

13. The semiconductor module according to claim 1, wherein the first semiconductor device has a plurality of first external terminals arrayed on the surface facing the substrate, and arrayed in a regular lattice pattern, and wherein the second semiconductor device has a plurality of second external terminals arrayed on the surface facing the substrate, and arrayed in a regular lattice pattern, and wherein the first external terminals and the second external terminals are electrically connected via a wiring layer of the substrate.

14. The semiconductor module according to claim 1, wherein the first semiconductor device has a plurality of first external terminals arrayed on the surface facing the substrate, and arrayed in a houndstooth check pattern, and wherein the second semiconductor device has a plurality of second external terminals arrayed on the surface facing the substrate, and arrayed in a houndstooth check pattern, and wherein the first external terminals and the second external terminals are electrically connected via a wiring layer of the substrate.

15. The semiconductor module according to claim 13, wherein the wiring layer includes pair wiring transmitting a differential signal.

16. The semiconductor module according to claim 14, wherein the wiring layer includes pair wiring transmitting a differential signal.

* * * * *